DIFFERENTIAL AMPLIFIER

Filed Jan. 12, 1968 4 Sheets-Sheet 1

INVENTORS
ERNEST P. BAKKE
ALLEN B. BENSON
RONALD J. BYMERS

BY J. E. Stanland
AGENT

United States Patent Office 3,548,333

Patented Dec. 15, 1970

3,548,333

DIFFERENTIAL AMPLIFIER

Ernest P. Bakke, Allen Bryce Benson, and Ronald J. Bymers, Rochester, Minn., assignors to International Business Machines Corporation, Armonk, N.Y., a corporation of New York Filed Jan. 12, 1968, Ser. No. 697,460
Int. Cl. H03f 3/68, 3/34
U.S. Cl. 330—30 10 Claims

ABSTRACT OF THE DISCLOSURE

A differential amplifier having high common mode rejection and good drift performance without loss of gain accuracy. Input current sources, having temperature compensating networks associated therewith, operate in conjunction with another temperature compensating network to provide overall drift compensation, and base current to the first differential stage. A feedback network coupled with a current regulator feeds current back to the input current sources to provide high common mode rejection. Common mode balance networks are provided to reduce the conversion of common mode signals to normal mode signals.

BACKGROUND OF THE INVENTION

Field of the invention

This invention relates to differential amplifiers and more particularly to a solid state differential amplifier having means to insure high common mode rejection and good drift performance without loss of gain accuracy.

Description of the prior art

Differential amplifiers are extremely useful for certain applications such as precise control applications, in which it is desirable that only the difference between two signals be amplified. However, as with all amplifiers, certain characteristics have to be present in order that the amplifier will work properly in a particular environment and for a particular purpose. In the case of a differential amplifier, the most important criterion and the one which is most difficult to achieve and maintain across a wide range of environmental conditions, such as humidity and temperature, is common mode rejection. That is, since the fundamental purpose of a differential amplifier is to amplify only difference signals which appear at its input, the amplifier must offer a very high impedance to common mode signals, so that the common mode signals which appear at both input terminals to the amplifier will not be amplied and appear in the output as an error.

There are a variety of ways in which common mode signals will appear at the inputs to the differential amplifier. One of these ways, and one which would occur even if one input to the differential amplifier were tied to ground and the other one driven, is the following. In many applications the signal source, such as a transducer or pressure gauge, is located a considerable distance from the amplifier itself and is connected thereto by long cables. Due to environment and so on, there may be pickup in these long cables which would cause a common mode noise voltage to appear at both inputs. Another example in which common mode signals may cause error voltages is one that is very common and raises as follows. Since most signal sources have an impedance, a flow of common mode current through these sources will produce a differential mode voltage which would be applied to the input of the differential amplifier and appear as an error voltage at the output. As it is impossible to eliminate source impedance, it is fundamental that the common mode signal not flow through the source impedance.

Further, rejection of common mode signals by the presentation of a very high common mode impedance to these signals is not always sufficient. Because various mismatches may occur within the amplifier itself, it is possible that a common mode signal will be converted to a normal or differential signal which will be amplified and appear at the output as an error voltage. In order to eliminate this common mode-normal mode conversion, particular networks are required within the amplifier. The overall result to be achieved is high common mode rejection.

Another very important criterion of a differential amplifier is its overall drift performance. That is, it is important that the amplifier output not drift with variations in temperature, humidity, etc. This criterion is difficult to achieve without sacrificing gain accuracy, as these two criteria are often influenced by the same circuitry. That these two criteria are very important is apparent, especially in many complex and sophisticated new processes. Such new applications include, for example, various control systems in which it is desirable to monitor three or four hundred parameters during a very short period of time, of the order of only one or two minutes. The information obtained must be accurate and must be obtained rapidly. Also, the amplifier must reject any disturbances resulting from pickup in cables dues to the great distance from the signal source to the amplifier, as was mentioned above. Depending upon the magnitude of the input signal levels, the gain accuracy and the drift performance must be excellent in order that large percentage errors do not occur.

Another important criterion is that the amplifier must be easily set up and adjusted in any alignment or compensation procedure. Also, the voltage offset in the output must be removable a zero control network. It is important that the alignment, compensation, and zero control adjustments can be made easily, without requiring numerous environmental changes.

Prior art differential amplifiers do not provide the necessary performance specifications with respect to gain accuracy, drift performance, and common mode rejection that are envisioned here. These prior art amplifiers use a great number of components and consequently are unduly complex and expensive. With respect to drift compensation, it is not enough that compensation is achieved only through the use of extremely good components, as this becomes exceptionally expensive and therefore prohibitive with respect to economy. The prior art methods of drift compensation do not give the low amounts of drift required (.01–02% of full scale) in differential amplifiers to be used in very complex and sophisticated processes. Further, the alignment and compensation procedures of these prior art amplifiers is often complicated and requires many environmental (for instance, temperature and humidity) changes.

In addition, prior art amplifiers do not have zero control networks in which the voltage offset (i.e., voltage offset from the desired output) is insensitive to the gain setting of the amplifier. That is, the voltage offset in the prior art amplifiers would be a function of the gain to which the amplifier is set. Further, in these prior art amplifiers, the introduction of zero control networks created other problems, such as the introduction of drift into the amplifier. These prior art zero control means also involved expensive circuitry.

OBJECTS

Accordingly, it is a primary object of this invention to provide an improved solid state differential amplifier which is inexpensive and reliable.

It is another object of this invention to provide an improved amplifier having very high normal and common mode impedance.

It is another object of this invention to provide a differential amplifier having an improved means for providing high common mode rejection.

Still another object of this invention is to provide a differential amplifier having an improved means for providing high common mode rejection, which means utilizes only passive components.

It is another object of this invention to provide a differential amplifier having an improved means of common mode balance, i.e., for preventing conversion of common mode signals to normal mode signals.

Another object of this invention is to provide a differential amplifier having improved means for overall drift compensation, wherein gain accuracy is not lost.

It is another object of this invention to provide a differential amplifier with an improved means for maintaining low input current drift in the first amplification stage.

Still another object of this invention is to provide a differential amplifier having an improved means for output zero control, which means is not complex and does not introduce other problems or expense.

Still another object of this invention is to provide an amplifier which can be easily aligned with a minimum number of temperature adjustments.

The foregoing and other objects, features, and advantages of the invention will be apparent from the following more particular description of the preferred embodiment of the invention as illustrated in the accompanying drawings.

SUMMARY OF THE INVENTION

Briefly, the preferred embodiment of this differential amplifier comprises three stages of differential amplification, although more or less can be used. Associated, primarily with the first differential stage, are various circuits which make the amplifier performance vastly improved. The amplifier is a solid state one in which the input signal to be amplified is applied to the bases of the differential stage transistors and taken off the collectors of these transistors. A feedback loop from the output to the emitter circuit of one of the first differential stage transistors is provided. After the third differenial stage, a single-ended amplification stage is provided and then a final output stage, which final output stage has a feedback loop. The final output stage provides low output impedance, and is not susceptible to deleterious effects due to shorting, hang-ups, etc. The internal feedback network around the final output stage is a control for the gain of that final stage.

Associated with the first stage of differential gain are two input control means, each of which is comprised of a Zener diode boot-strapped current source, and its associated temperature compensating network. These temperature compensating networks are actually located within current divider networks, which direct the current from the input current sources to both the base and the emitter of the transistors in the first differential stage. The input control means enables the base-emitter voltages of the first stage transistors to be equal, so that low current drift with temperature will be insured. This will be explained more fully later. Further, the input control means reduces the necessary operating collector current in the input transistors (the transistors in the first differential stage), thus reducing the base current required by the first stage transistors. This minimizes amplifier input current drift. Still further, each input control means, in combination with the common mode rejection means, provides high common mode and normal mode impedance and therefore aids in achieving high common mode rejection. The input control means also acts in conjunction with an output control means to compensate for output voltage drift with temperature.

The output control means is comprised of an overall temperature compensation network and a zero control network. The overall temperature compensation network operates in conjunction with the input current sources of the input control means to compensate the whole amplifier for drift due to temperature, humidity, etc., as mentioned briefly above. Through these networks, output voltage drift is compensated. The overall temperature compensating network comprises various resistors and a thermister connected to ground, while the zero control network comprises a plurality of potentiometers (or a single one depending upon required resolution) which are connected to the emitter circuitry of the input current sources in the input control means.

Common mode rejection means is provided to insure that both high common mode and high differential mode impedance are present, so that good rejection of common mode signals will result. It is a fundamental feature of this amplifier that common mode signals are eliminated at the collectors of the transistors in the first differential stage so that they will not be present at succeeding differential stages. The common mode rejection means comprises a common mode regulator, a common mode loop, and a common mode feedback network.

As mentioned previously, common mode signals may flow through the input signal source (the source of input differential voltage). This flow of common mode current through the input signal source creates a differential, or normal, mode signal at the input terminals. This is an error signal which would be amplified and appear at the output as an error, and it is important that these signals be eliminated. This is accomplished by the combination of the common mode rejection means (specifically, the common mode feedback network) and the input control means. This combination "bucks" out the differential signal, due to common mode currents flowing through the input signal source, by supplying current to the input transistors in the first differential stage, so that common mode current will not be drawn.

In addition, there may be actual common mode signals at the bases of the input transistors. These common mode signals have to be eliminated in the first differential stage, if possible. The means for doing this is the combination of the common mode regulator and common mode loop. This combination "bucks" out input common mode signals and eliminates them at the collectors of the input transistors. The common mode loop provides an amplfied replica of the input common mode signal to the common mode regulator. The regulator then provides current to the emitter circuitry of the input transistors so that the collector currents of these transistors are maintained essentially constant. In this way, the output of the amplifier will remain at zero potential, whenever a common mode voltage appears at the inputs.

Even though the common mode currents in the collectors of the input transistors are small, due to the action of the common mode rejection means and the input control means, a differential mode voltage can still be generated due to imbalances on each half of the differential amplifier. Imbalance of this type generally varies with the gain setting of the amplifier. The balance control means is used to prevent these imbalances, so that common mode-normal mode conversion will not result.

The balance control means comprises the bucking common mode balance and the potentiometric common mode balance. The potentiometric common mode balance comprises a series of potentiometers, one for each gain setting, which are connected to the emitter circuitry of the input transistors. The bucking common balance is a resistive network that is connected between the emitter circuitry and the collector circuitry of the input transistors.

BRIEF DESCRIPTION OF THE DRAWINGS

FIG. 2*a* is a schematic diagram of part of the inventive amplifier.

FIG. 2*b* is a schematic diagram of the rest of the inventive amplifier.

DESCRIPTION OF THE PREFERRED EMBODIMENT

General description

Figures 1, 2:
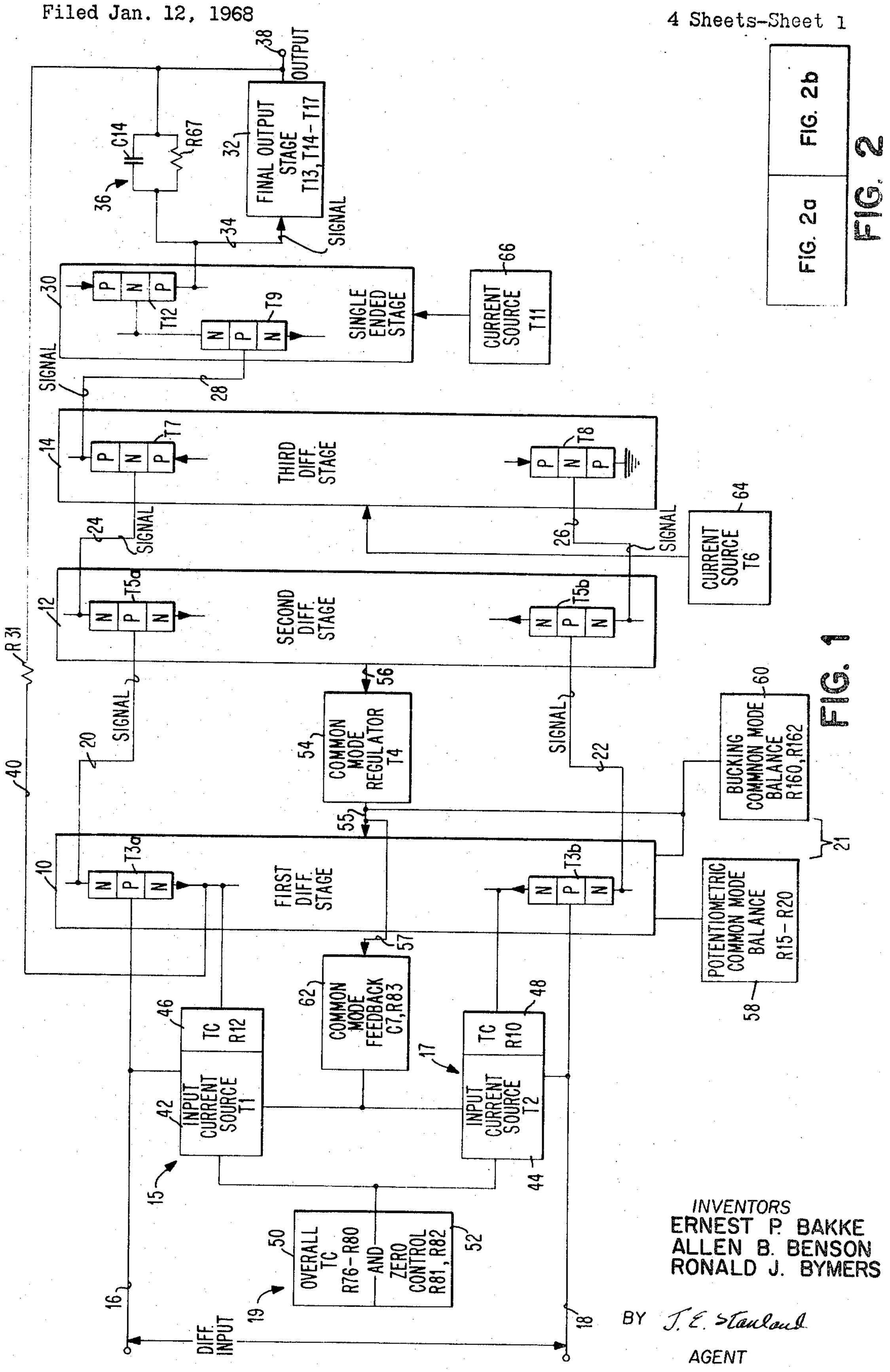
FIG. 1 is a block diagram showing the functional units which comprise the inventive amplifier.
FIG. 2 is a diagram which shows how

FIG. 1 shows a functional block diagram of the subject differential amplifier. In each block, the notations for the components are those which are used in FIGS. 2*a*, 2*b*, and 5 so that easy reference to these figures is possible.

As is readily apparent from FIG. 1, the amplifier consists of three differential stages, 10, 12, 14, the third (14) of which is differential at its input and single ended at its output. It is understood that more or less differential stages could be used. The differential input is applied on leads 16, 18 to the bases of transistors T3*a*, T3*b* in the first differential stage 10. The outputs from the first differential stage are taken off the collectors of transistors T3*a*, T3*b*, and applied via leads 20, 22 to the bases of transistors T5*a*, T5*b* which are in the second differential stage 12. The outputs from the second differential stage 12 are taken off the collectors of the aforementioned transistors T5*a*, T5*b* and applied, via leads 24, 26 to the bases of transistors T7, T8, respectively, which transistors comprise the third differential stage 14. An output is taken from the collector of transistor T7 via lead 28, while transistor T8 has its collector tied to ground. Therefore, the third differential stage 14 has a differential input and a single-ended output. The signal is then appied to the single-ended stage 30, which is comprised of transistors T9, T12. This is essentially a gain stage comprising a grounded emitter section and a series feedback section.

After amplifiaction in the single-ended stage 30, the signal enters the final output stage 32 via lead 34. This final stage is comprised of an emitter follower T13 and a push-pull amplifier T14–T17. The closed loop feedback path 36 comprising capacitor C14 in parallel with resistor R67 is used to control the gain of the final output stage. Control of the gain in this final stage is achieved by controlling the amount of current fed back by the loop 36.

Generally, it is a requirement of an amplifier that the output can be shorted without harming the amplifier itself, i.e., without burning out any elements or causing any problems as far as component degradation or heating is concerned. Being able to short circuit the output of the amplifier facilitates the alignment of the amplifier. Also, it is required that the amplifier be able to rapidly swing into recovery after it has been saturated due to a noise condition. Further, the output impedance of the amplifier should be very low in order to withstand changes in the load impedance. The transistors T14–T17 form a push-pull amplifier which is short circuit proof and has symmetrical driving properties. This internal closed loop amplifier is Class A–B for symmetrical drive.

The output appears at terminal 38 and is also fed back via lead 40 to the first differential stage 10 thru resistor R31. The purpose of the feedback loop 40 is to control gain accuracy and stability (drift). Since error signals can develop throughout the amplifier due to drift (from components, aging, environment etc.), it is desirable that the voltage offset signal at the output be minimized, so that percentage errors will be low. If an overall feedback network is present, the output signal will be divided by the excess gain that is removed by the feedback, and the offset error at the output will be reduced.

In addition to these basic amplification stages 10, 12, 14 other networks are provided to enhance the circuit performance. These additional networks provide the exceptional common mode rejection, gain accuracy, drift performance, and high common mode and normal impedance which make this amplifier an extremely high performance amplifier. Two input control means 15, 17 are provided, means 15 being associated with input transistor T3*a* and means 17 being associated with input transistor T3*b*. Input control means 15 is comprised of an input current source 42 and a temperature compensating network 46, while input control means 17 is comprised of input current source 44 and temperature compensating network 48. As shown in FIG. 1, a connection is made from each temperature compensating network 46, 48 to the emitter circuit of the associated input transistor. In each control means there is also a connection (not shown in FIG. 1) from its input current source to the base of the associated input transistor. Thus, there is a current divider network connected between each input current source and its associated input transistor, wherein one branch of each current divider network has temperature compensating means therein. The input control means are vital to the operation of this amplifier and they serve six main functions, which are the following:

(1) Generally, it is difficult to maintain high gain accuracy and low voltage drift with temperature. It is known that, in order to provide low offset voltage drift, the base-emitter voltages of the transistors in the first differential stage 10 must be equal. (Hoffait, Thornton "Limitations of Transistor DC Amplifiers," Proc. IEEE, p. 179, February 1964.) The input current sources 42, 44 provide current to the emitter circuitry of the transistors in the first differential stage while at the same time maintaining a very high input impedance, so that the gain accuracy is not lost. By adjusting the input current sources (and thus the amount of current into the emitter circuitry of the first differential stage) the base-emitter voltages of the transistors in the first stage are made equal, thus insuring low offset voltage drift with temperature.

(2) The base current requirements of input transistors T3*a*, T3*b* very with temperature. Since it is not desirable to draw common mode input current through the source impedance (this would create a differential mode voltage at the input which would be amplified and appear as an output error), the input current sources, in conjunction with the temperature compensating networks 46, 48 provide the required temperature compensated base current to the first stage transistors. Hence, common mode input current will not be drawn through the source impedance in order to meet the base current requirements of the input transistors.

(3) The input current sources 42, 44 reduce the necessary operating collector current of input transistors T3*a*, T3*b*. If the necessary operating collector current in these transistors is reduced, the demand for base current into these transistors will be reduced. Hence, if the required base current is kept low, there will be low base current drift with temperature.

(4) The input current sources 42, 44 operate in conjunction with the output control means 19 to compensate for output voltage drift with temperature. A thermister in temperature compensating network 50 has a temperature dependent resistance and is connected to ground. A change in the resistance of this thermister will result in a varying amount of current that will be taken by the network 50 from the current source to which it is connected. This temperature varying current will equalize the collector current drift of the input current source transistors T1, T2 and can generate a temperature varying signal at the emitters of the input transistors T3*a*, T3*b* in the first differential stage. This will compensate for output voltage drift of the amplifier, due to drift occurring anywhere within the amplifier.

(5) Adjustment of current sources 42, 44 provides a manual means of adjusting the output voltage via the output control, 19.

(6) Current sources 42, 44 when used in conjunction with common mode feedback 62 provide a means of feeding back common mode currents to the inputs 16, 18. The feedback to the inputs is by the same network which provides required base current to the input transistors T3*a*, T3*b*. The common mode feedback is instrumental in providing high common mode impedance for the amplifier, since it prevents the flow of common mode currents through the input signal source.

The output control means 19 corrects the amplifier for changes in its output due to aging, drift, etc. This means 19 is comprised of an overall temperature compensating network 50 and a zero control 52.

The overall temperature compensating network 50 provides an input to either input currents source 42 or input current source 44, depending upon whether the output drift is positive or negative with increasing temperature. This temperature compensating network 50 is comprised of only passive elements, there being four resistors and one thermister, in the preferred embodiment. Due to the particular circuitry used, the set-up time to compensate the amplifier is minimal. Only one temperature change is required.

The zero control network 52 comprises a plurality of potentiometers which are used to achieve high resolution. Through this zero adjustment, the base-emitter voltages of the input transistors in the first differential stage 10 are made equal. In this amplifier, the voltage offset, which is to be corrected by the zero control, is insensitive to gain. The particular zeroing control used is inexpensive and does not introduce other problems into the amplifier. In the particular zeroing control illustrated in FIG. 1, the zero control 52 acts directly in conjunction with the input current sources 42, 44.

The common mode rejection means is used to provide high common mode and differential mode impedance, so as to minimize the presence of common mode currents in the collectors of the input transistors. In this amplifier, the common mode signals are eliminated in the collectors of the first differential stage transistors, so that common mode signals will not exist in any succeeding stages. This, of course, means that the circuitry of succeeding stages need not be complex and expensive, as common mode signals have already been eliminated. The common mode rejection means comprises a common mode regulator 54, a high gain common mode loop 56, and a common mode feedback network 62.

The common mode loop 56 and the common mode regulator 54 provide current so that the output will remain at zero potential when input common mode signals are present. However, because small common mode current will still exist in the collectors of the input transistors, a compensating current is provided to eliminate the need for increased base current into these input transistors. The common mode feedback network 62 provides feedback from the common mode regulator 54 to the input control means, which input control means then provide the required base current into the input transistors. In this way, common mode current will not be drawn through the input source impedance in order to supply the collector currents which are lost through collector-base resistances, etc., as was outlined previously.

The common mode regulator 54 is connected via loop 56 to the emitters of transistors T5*a*, T5*b* which comprise the second differential stage 12. This connection 56 is a high gain feed-back loop, designated as the common mode loop. The common mode regulator provides an input to the first stage 10 via lead 55 and to the common mode feedback network via lead 57. The common mode regulator 54 functions to achieve high common mode rejection, high common mode input impedance, and high differential mode input impedance. This regulator functions as a current regulator, rather than as a constant current source, if a common mode voltage is present. Its action serves to maintain the output at zero potential if a common mode signal appears at the inputs 16, 18 of the amplifier. If the voltage at the emitters of transistors T5*a*, T5*b*, in the second differential stage 12 begins to change due to common mode signals, the change will be amplified through the common mode loop 56 and will change the collector current of transistor T4*a*, the common mode regulator. This adjustment in collector current of transistor T4*a*, as required by a common mode input voltage, means that the collector currents, and hence the base currents of input transistors T3*a*, T3*b* in the first differential stage 10 will change only slightly. Thus, the high gain of the common mode loop 56, in conjunction with the common mode regulator 54, makes possible high common mode input impedance. In this common mode regulator 54 matched transistors are used in order to provide good temperature characteristics. (Refer to FIG. 2*a*.).

The common mode feedback network 62 receives its input from the common mode regulator 54 and delivers a current to both input current sources 42, 44. This feedback network 62 is comprised only of passive elements, and principally a parallel combination of resistance and capacitance (C7, R83). Because some change in the current to the input of the amplifier would result due to base-collector resistance of T3*a*, T3*b*, etc., the required base current provided by input current sources 42, 44 must change. The common mode feedback network, in conjunction with the input current sources 42, 44 provide the additional required base current to the input transistors T3*a*, T3*b*, so that common mode current will not be drawn through the input signal source impedance. Therefore, the result is that a very high impedance will be presented to common mode currents. The common mode rejection means, comprising the common mode loop 56, the common mode regulator 54 and the common mode feedback network 62 provides extremely high common mode rejection at the first differential stage of the amplifier.

Even though the common mode currents in the collectors of the input transistors T3*a*, T3*b* (first differential stage) are small, they can still generate a differential mode (normal mode) voltage due to imbalances in the collector load impedances and imbalance in the common mode current changes in the two collectors. Therefore, common mode balance is required. The balance control means 21 comprises two means for providing common mode balance, one of which is the potentiometric common mode balance 58 and the other of which is the "bucking" common mode balance 60. The potentiometric common mode balance 58 is connected to the emitter circuits of the transistors in the first differential sage 10 while the "bucking" balance 60 is connected between the emitter circuitry and collector circuitry of the differential stage transistors T3*a*, T3*b*. Thus, the balance control means 21 eliminates mismatch in balance, which would cause a conversion of common mode to normal (differential) mode. By the means presented here, changes in balance due to changes in gain settings are compensated.

Current sources are provided for the third differential stage 14 and for the single-ended stage 30. These are generally designated as 64 and 66, respectively. These current sources maintain operating currents without lowering the interstage impedance. This is important in order to maintain sufficient loop gain, especially in the internal feedback loop around the final output section.

As mentioned previously, there is feedback from the output, via line 40, to the emitter circuitry of the transistors in the first differential stage 10. The purpose of this feedback, which applies the output in series with the input signal at one emitter of the first differential stage, is to control gain accuracy and stability.

Detailed description

Figure 2A:
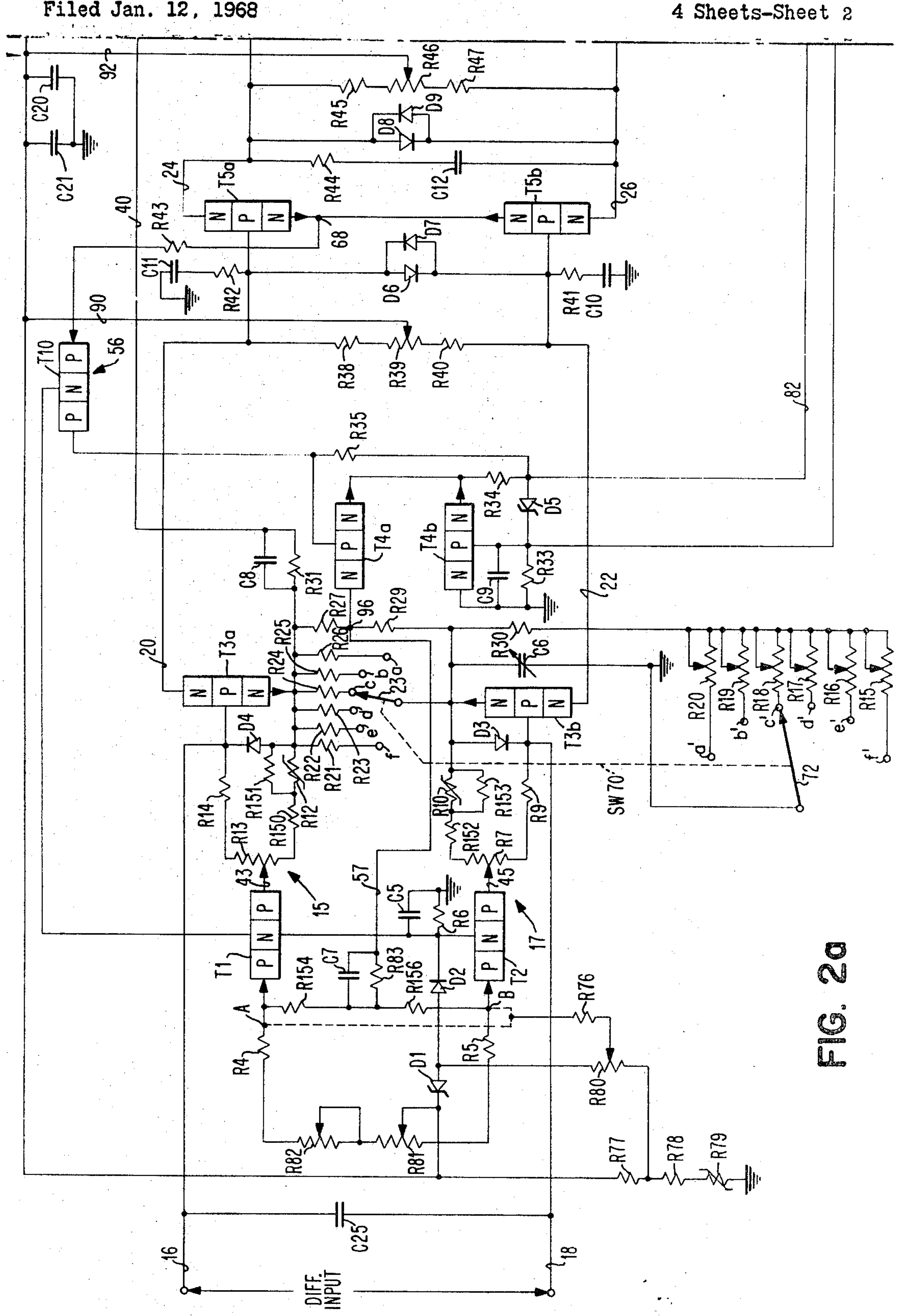
FIGS. 2*a*, 2*b* are to be viewed.
Figure 2B:
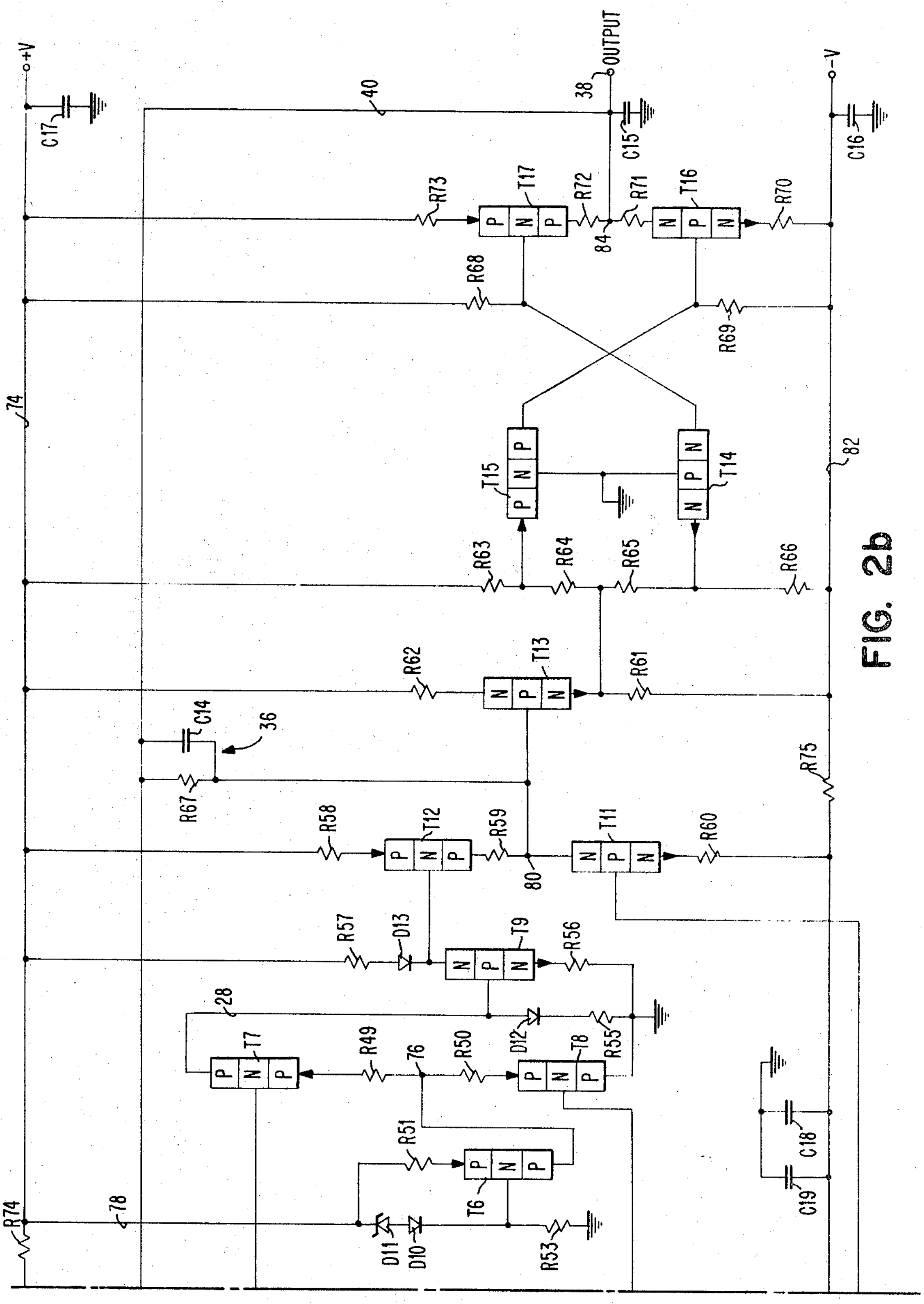

The detailed schematic of this amplifier is shown in FIGS. 2*a*, 2*b*, which are to be joined together as illustrated diagrammatically in FIG. 2.

Referring to FIGS. 2*a*, 2*b* in conjunction with FIG. 1, this amplifier is comprised of three differential stages, generally designated 10, 12, 14. The first differential stage 10 is comprised of transistors T3*a*, T3*b*, the second differential stage is comprised of transistors T5*a*, T5*b*, and the third differential stage 14 is comprised of transistors T7, T8. T3*a*, T3*b* are matched transistors, as are T5*a*, T5*b*, in order to provide good balance on each side of the first and second differential stages. If one input is tied to ground and the other is driven, the collector of one of the first differential stage transistors will increase in voltage while the collector of the other transistor in that stage will decrease by the same value; hence, differential action will be obtained. These collectors feed the bases of the transistors T5*a*, T5*b*, comprising the second differential stage 12. As with the first differential stage, the base of one of the transistors in the second stage will increase in voltage while the base of the other transistor will decrease in voltage because of the differntial input signal from the first stage. Their collector voltages will be in opposite polarity. This is generally based on the fact that a constant current source is provided for each differential stage. The total emitter current in each differential stage is constant, so that the total collector currents in each stage are also constrained to be constant.

Although a differential signal is provided at the input of the third differential stage 14, the output of this stage is single-ended and is derived from the collector of transistor T7. This signal is then brought through the single-ended stage 30 (comprising transistors T9, T12) before entering the final output stage 32, which is comprised of an emitter follower (transistor T13) and the final output circuitry comprising transistors T14–T17. An internal feedback loop 36, comprising the parallel combination of resistor R67 and capacitor C14 is provided between the output at terminal 38 and the input to the final output stage 32. This inner loop feedback network controls the gain of the final output stage 32. Further, the output signal is fed back through the feedback resistor R31 to the emitter of transistor T3*a* in the first differential stage 10, where it is applied in series with the differential input to ths first differential stage. The purpose of this feedback has been mentioned previously.

In order to provide precise balance in the front end of the amplifier, resistor R30 is connected to one of the potentiometers R15, R16 . . . R20 and then to ground. This precise balance is required for good common mode rejection, in that a high and balanced common mode impedance is necessary for good common mode rejection. The combined impedance of R30 one of the potentiometers R15, R16 . . .R20 is approximately that of resistor R31. Therefore, when the amplifier is balanced by tuning one of potentiometers R15, R16 . . . R20 the impedance of the front end (stage 10) is perfectly balanced and good common mode rejection results. Of course, for purely differential mode signals, this precise balance is not required.

The voltage gain of this amplifier is given by the following expression:

$$A_{V'}=\frac{A_{VOL}}{1-\dfrac{A_{VOL}}{1+\dfrac{R27+R29+R_x}{R27R_x}R31}} \quad (1)$$

where:

$A_{V'}$ is the closed loop voltage gain,
$A_{VOL}$ is the open loop voltage gain,
$R_x$ is any gain resistor (R21, R22 . . . R26 in FIG. 2*a*).

The gain accuracy of this amplifier is a function of the ratio accuracy of gain resistors R21, R22 . . . R26 to resistors R27 and R29 and to feedback resistor R31. Resistors R27, R29 are located in the emitter circuits of transistors T3*a*, T3*b*, which comprise the first differential stage 10. The accuracy is also a function of the known variations of open loop gain. Such variations may arise from transistor changes through aging, temperature, and humidity. Also, similar amplifiers may differ from one another, due to differences in component properties.

The temperature coefficient of the gain is mainly a function of the temperature tracking of the same resistor ratios which determine the gain.

Referring more particularly now to FIG. 2*a*, matching transistors T3*a* and T3*b* are the input stage 10 of differential gain. A differential signal applied to input terminals 16, 18 is translated to the bases of these transistors. In turn, their collectors feed the differential signal via leads 20, 22 to the bases of the transistors comprising the second stage 12 of differential gain. The transistors in the second differential stage are the matched pair T5*a*, T5*b*, which feed the differential signal, on leads 24, 26, to the next differential stage 14. In this amplifier, unlike other differential amplifiers, transistor T4*a* is not a constant current source when common mode voltage is present. Instead, it functions as a current regulator, and is designated the common mode regulator 54 (FIG. 1). The importance of this regulator action will be explained later in terms of its relevance to high input impedance, both common mode and normal mode.

The first differential gain stage 10 comprises transistors T3*a*, T3*b*. Their collectors are connected to load resistances R38, R40 between which is an alignment means (potentiometer R39). The wiper of potentiometer R39 is connected to the positive bias line 74 via lead 90. R39 is used for alignment purposes as will be explained more fully later. The emitter electrodes of these two transistors are connected together through resistors R27 and R29. Also, there is a connection between the emitters of these two transistors along the contact 23, which is connectable to any of the gain resistors R21, R22 . . . R26. As is apparent from this figure, six gain positions are provided, although it is to be understood that this is variable and that more or less can be provided.

Diode D3 is connected with its anode tied to the emitter of transistor T3*b*, while its cathode is connected to the base of this transistor. Similarly, diode D4 has its cathode connected to the base of transistor T3*a*, while its anode is connected to the emitter of this transistor. Diodes D3 and D4 are provided for protection of the base-emitter junctions of the input transistors T3*a*, T3*b*, respectively. That is, these diodes protect the input transistors when large differential inputs are present. Such high voltages could easily occur, for instance, if the amplifier inputs were multiplexed. Since there are large inductances in multiplex lines, large transient voltages develop when line relays are opened. Consequently, it is important in this and other applications, to protect the base-emitter junctions from reverse breakdown.

Resistors R38, R40 are load resistors and alignment potentiometer R39 is used for adjusting the differential voltage at the collectors of T3*a*, T3*b* during alignment. A variable capacitor C6 is connected from the emitter of transistor T3*b* to ground. This capacitor has a function which will be explained in more detail in conjunction with the discussion of the balance control means 21, but for the present it is sufficient to say that capacitor C6 is for balancing the reactive components of error voltage generated in the collectors of the input transistors T3*a*, T3*b*, due to a common mode input, thus providing optimum common mode rejection at frequencies above 10 cycles per second. In order to have good common mode rejection, the common mode impedances of both sides of the first differential stage must be balanced. Resistors R15, R16 . . . R20 provide resistive balance, while capacitor C6 provides variable reactive balance. Therefore, imbalances in common mode impedance which would cause error voltages when common mode signals are present, are prevented.

The input control means 15, 17 are comprised of the input current sources 42, 44, respectively and the current division networks having therein the temperature compensation networks 46, 48 respectively. As mentioned previously, each input current source feeds both the base and the emitter of its associated input transistor; that is, a current divider network is provided from each input current source to the associated input transistor. In that branch of the current divider network which connects an input current source to its associated input transistor there is provided a temperature compensation means 46 or 48. In the functional block diagram of FIG. 1, the connections from both the base and emitter of the input transistors to the associated input current source are shown. The input current sources are comprised of Zener diode bootstrapped transistors T1, T2. The temperature compensation networks 46, 48 comprise thermistors whose resistance varies with temperature, so that the amount of current provided to the bases of the input transistors by the current sources T1, T2 varies in order to meet that which is required for operation of the input transistors T3*a*, T3*b*. Since the current provided by the current sources T1, T2 compensates for the changes in required base current to the input transistors, this insures that common mode current will not be drawn through the signal source impedance, so that error voltages will not result on the collectors of the input transistors. The detailed operation of the input control means will be explained more fully below.

Transistors T1, T2 are PNP transistors whose base electrodes are tied together. The collector of each of these transistors T1, T2 is connected to a current division network, wherein each current division network is comprised of a potentiometer and two branches which are resistive. In one of the branches is a thermistor, which is a temperature compensation means. Specifically, the collector of each of these transistors T1, T2 is connected to the wiper (43 or 45) of a potentiometer (R13 or R7) whose end terminals are connected to branches of a parallel network. One of these branches connects to the base of an input transistor (T3*a* or T3*b*), while the other branch connects to the emitter of the same input transistor.

In more detail, the collector of transistor T1 is connected to the wiper 43 of potentiometer R13, one of whose end terminals is connected to resistor R14 and then to the base electrode of transistor T3*a*. The other end terminal of potentiometer R13 is connected through R150 and then through a parallel combination of R151 and thermistor R12. This parallel combination of thermistor R12 and resistor R151 is thereafter connected to the emitter circuit of transistor T3*a*. The collector of transistor T2 is connected to the wiper 45 of potentiometer R7, one of whose terminals is connected to a series circuit comprising resistor R152 in series with the parallel combination of thermistor R10 and resistor R153. The final connection of this parallel combination of R10 and R153 is connected to the emitter circuit of transistor T3*b*. The other terminal of potentiometer R7 is connected to resistor R9 and then to the base circuit of transistor T3*b*.

The emitters of transistors T1, T2 are connected to the output control means 19, i.e., the emitters of the input current sources T1, T2 are connected to the zero control network 52 through resistors R4, R5, respectively. Further, the emitters of transistors T1, T2 are connected to the overall temperature compensating network 50 through resistor R76. A final connection is provided to the emitters of input current source transistors T1, T2 through the feedback network comprising the parallel combination of capacitor C7 and resistor R83, and resistances R154 and R156. This last mentioned feedback network is the common mode feedback network 62 from the collector of transistor T4*a*; it will be explained in more detail later, in conjunction with the common-mode rejection means. While the base circuits of input current sources T1, T2 are tied together they are also tied to ground through the parallel combination of resistor R6 and capacitor C5. Capacitor C5 is for filtering the noise so that just a DC voltage appears on the bases of T1, T2. R6 provides biasing current to the Zener diode D1 while diode D2 compensates for temperature effects of diode D1. Therefore, the bases of input current sources T1, T2 are at signal ground and there is only a DC voltage level at the bases of these transistors.

As was mentioned earlier, the input control means 15, 17 provide six main functions. These functions will be discussed now.

(1) Generally, it is difficult to maintain high gain accuracy and low voltage drift with temperature. It is known that, in order to provide low voltage drift, the base-emitter voltages ($V_{be}$) of the transistors in the first differential stage 10 must be equal. The input current sources T1, T2 provide current to the emitter circuitry of the first differential stage transistors T3*a*, T3*b* while at the same time maintaining a very high input impedance so that the gain accuracy is not lost. In this way, the base-emitter voltages of the transistors in the first differential stage can be made equal by adjustment, thus insuring low current drift with temperature. In order to more fully understand this function, reference is made to FIGS. 3*a*, 3*b*.

Figure 3A:
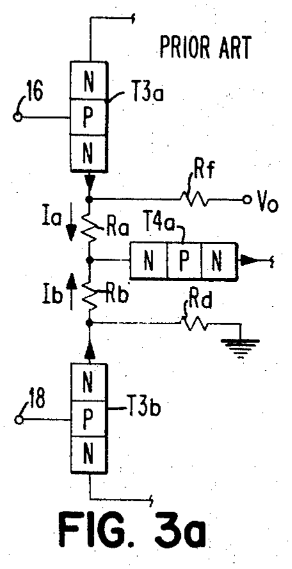
FIG. 3*a* is a diagram of the first stage of a prior art differential amplifier.

FIG. 3*a* shows a prior art means for providing this function in the transistors of the first differential stage of an amplifier. In order to more fully describe this circuit and that in FIG. 3*b*, the transistor elements are labeled as they appear in the circuit diagram of FIG. 2*a*. That is, transistors T3*a*, T3*b* are the transistors in the first differential stage while transistor T4*a* is an active element connected to the emitter circuits of these transistors. In the prior art circuit, transistor T4*a* is a constant current source, rather than being a current regulator, as is the case in the instant disclosure. Here, the input would be applied to terminals 16, 18 and the output taken as marked ($V_o$). The emitters of transistors T3*a*, T3*b* are connected together through resistances $R_a$, $R_b$. In both this figure and FIG. 3*b*, it is to be understood that many components are omitted and that these drawings are presented for illustration only.

In FIG. 3*a*, if the output is set to zero volts (by adjustment controls which are not shown) for all inputs at zero potential, it can readily be seen that:

$$V_{be}(a)+I_aR_a=V_{be}(b)+I_bR_b \quad (2)$$

In a potentiometric type of amplifier, where there is feedback to the emitters of the first differential stage, high gain accuracy is a function of the accuracy of the ratios of $R_f$, $R_a$ and $R_b$. In FIG. 3*a*, high gain accuracy is possible since these resistances are fixed values, and therefore fixed ratios are obtained. However, the base-emitter voltages of transistors T3*a*, T3*b* are not necessarily equal due to the fact that the $V_{be}$ v. $I_e$ characteristics of each of these transistors are not exactly equal. That is, it is very difficult to obtain perfectly matched transistors. Even if a potentiometer were incorporated in series with resistances $R_a$ and $R_b$, and if the collector of T4*a* were connected to the wiper of this potentiometer, an accurate solution would not be obtained. This is so because, by incorporating a potentiometer into $R_a$ and $R_b$, adjustments can be made to equalize the base-emitter voltages of the transistors T3*a*, T3*b*. However, there will be a sacrifice in high gain accuracy since now the resistances $R_f$, $R_a$ and $R_b$ have ratios which are no longer precisely fixed.

Figure 3B:
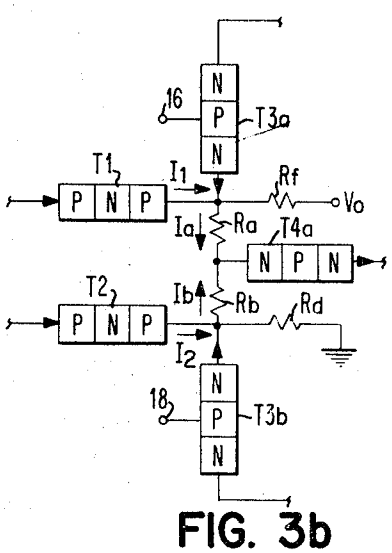
FIG. 3*b* is a diagram of the first differential stage of the subject invention.

In order to alleviate these problems, the circuitry illustrated in FIG. 3*b* is employed in the present amplifier. By using this circuitry high gain accuracy and low voltage drift in the first stage is achieved without undue compromise. Here, input current source, represented by transistors T1, T2, are connected to the emitter circuits of transistors T3*a*, T3*b*, which comprise the first differential stage of the amplifier. Input signals are applied to terminals 16, 18 while the output voltage is labeled $V_o$. In this case, however, transistor T4*a* functions as a current regulator when common mode signals are present. Due to the particular bias on the input current sources T1, T2, as well as to their inherent characteristics, their impedances are very much greater than the impedance represented by $R_a$, $R_b$. Therefore, they do not affect the ratios of resistances $R_f$, $R_a$, $R_b$, so that high gain accuracy is now possible. By adjusting the current output from the current sources T1, T2 it is possible (as explained later in the alignment procedure) to adjust currents $I_a$ and $I_b$ so that the base-emitter voltages of transistors T3*a*, T3*b* are equal. As before, this assumes zero output voltage for zero input potential. Since the input current sources consist of high current gain transistors, there will be very little base current into current sources T1, T2; therefore, the emitter current from each current source is approximately equal to its collector current. The current through resistance $R_a$ is equal to the emitter current of transistor T3*a* plus the collector current from transistor T1 ($I_1$). Since the output voltage $V_o$ is zero, only a very small fraction of current goes through resistance $R_f$. This amount of current is fixed. By varying the total currents $I_a$, $I_b$, the voltages $V_{be}(a)$ and $V_{be}(b)$ can be made equal.

The transistor T4*a* represents a very high impedance and is a sink for the current that becomes $I_a$, $I_b$. Its specific action as a regulator will be described later in more detail and reference is made to the discussion of the common mode regulator. For the purpose of describing the particular function of the input current sources described here, it is sufficient to say that transistor T4*a* is essentially a current source, acting really as a sink for the current $I_a$, $I_b$. Its action in the overall amplifier is described more fully later on.

(2) The second function of the input control means 15, 17 is to provide operating base current to input transistors T3*a* and T3*b*. The collector currents of input current sources T1, T2 are split to the base and emitters of transistors T3*a*, T3*b* by current divider networks, as mentioned previously (FIG. 2*a*). The impedance of these divider networks to the emitter of either transistor T3*a* or transistor T3*b* is much less than the impedance to the base of this particular input transistor. This gives the impedance of the current source, as seen at the input (transistors T3*a*, T3*b*) a multiplication factor which helps maintain high input impedances to the differential amplifier. That is, the closer the wipers of potentiometers R13, R7 are to the emitters of T3*a*, T3*b* respectively, the less the effect of the input current source impedance on the common mode impedance of the amplifier. For instance, if the collector of input current source T1 were connected directly to the base of transistor T3*a*, the impedance of T1 would be tied directly to the input. Due to the current divider networks, a high input impedance is maintained.

Since both current divider networks are identical in operation, only the one for transistor T3*a* will be described. The current divider network for this input transistor consists of resistor R14, potentiometer R13, and the parallel combination of thermistor R12 and resistor R151, where this parallel combination is in series with resistance R150. The setting of potentiometer R13 will determine the exact division of the collector current from transistor T1 and will be adjusted as explained in part 5 of the alignment procedure (to be described more fully later). As the circuit temperature increases, the required base current for input transistor T3*a* decreases. Thermistor R12 decreases in resistance with increasing temperature, thus more of the collector current of transistor T1 is supplied to the emitter of input transistor T3*a* and less will go to the base of this transistor. This effect compensates for input current temperature drift of the amplifier since, as was said previously, the required base current for transistor T3*a* decreases with temperature. Hence, common mode current need not be drawn through the source impedance. The resistor R151 in parallel with the thermistor R12 makes the equivalent resistance change of this parallel network (R151 and thermistor R12) more linear in order to compensate for the almost linear change (with temperature) in required base current to transistor T3*a*.

(3) The third function of the input control means 15, 17 is to reduce the necessary operating collector current in input transistors T3*a*, T3*b*; if this is done there will be a reduction in the required base current for these transistors. This is so because for a transistor amplifier with collector current $I_c$, base current $I_b$, and emitter current $I_e$, $I_c=\beta I_b$, where $\beta$ is the base-collector current amplification factor. That is, the transistor need not be driven so hard in order to provide the necessary operating collector current if the operating collector current is reduced. If low base currents are achieved, there will be very low base current drift with temperature.

In the present amplifier, it would be desirable to have these low collector currents be on the order of 20 microamps. Referring to FIG. 2*a*, for a maximum common mode input voltage of +10 volts, transistor T4*a* must still conduct some current and 10 v./R31, 10 v./R30 must flow from the emitter of T3*a* through R31 and from the emitter of T3*b* through R30 (actually, one of the potentiometers R15, R16 . . . R20 is also in series with R30). This requires more current than is supplied by the emitter currents of T3*a*, T3*b*. That is, it is desirable that T4*a* not leave its linear range of operation; transistor T4*a* should not saturate at the normal operating range of the amplifier (transistor T4*a* is kept conducting so that it is properly biased; also, it is desirable that transistors T3*a*, T3*b* not cut off, so they are kept conducting also). The required extra current is provided into the emitter circuits of T3*a*, T3*b* by current sources T1, T2. In this way the input transistors T3*a*, T3*b* need not be driven by a high base current in order that high collector currents, approximately equal to emitter currents, are provided.

In order to see this more easily, reference is again made to FIG. 3*b*. In this figure, a common mode input voltage of +10 volts will mean that the emitters of transistors T3*a*, T3*b* will be at +10 volts. In this figure, resistor $R_f$ is analogous to R31 and $R_d$ is analogous to resistance R30 plus one of the potentiometers R15, R16 . . . R20 (FIG. 2*a*). Hence, 10 volts/$R_f$ must flow through resistance $R_f$, and a current of 10 v./$R_d+R_i$, where $R_i$ is one of the potentiometers R15, R16 . . . R20, must flow through resistance $R_d$. If $R31=250$ K. and $R30+R_i=250$ K., this would require that 40 microamps flow through these resistances. However, as stated before, it is desirable that the collector current by kept low and, since the emitter current is approximately equal to the collector current if the input base current is very low, only about 20 microamps will be provided by the transistors T3*a*, T3*b*. Therefore, in order to provide this necessary current, the current sources T1, T2 provide currents $I_1$, $I_2$ which supplement the current produced by transistors T3*a*, T3*b* respectively. Therefore, transistors T3*a*, T3*b* need not be driven hard in order to supply the current which is demanded by a common mode input voltage of, in this case, 10 volts. Since the collector current of transistors T3*a*, T3*b* can be kept small, the base currents are also small and therefore very low base current drift in the input of the differential amplifier will result.

Generally, with transistor amplifiers, an error effect results from the need for base currents into the first differential stage. However, it is desirable to keep the base current low, not only because this will reduce base current drift, but also because this will reduce the amount of common mode current which flows through the input signal source (transducer, etc.) impedance. There are two inputs to the differential amplifier. As with most input signal sources, internal impedance is present, so common mode current will flow through this source impedance into one of the input transistors. If this current is large enough, a significant voltage drop can occur across the input signal source impedance, which voltage drop the differential amplifier will amplify as a difference signal. This would then appear as an error in the output of the amplifier. Consequently, this error is minimized by preventing the common mode current from flowing through the input signal source. However, in order to operate, the input transistors require a certain base current. Because part of this required base current is supplied by the current source transistors T1, T2 through the current divider networks previously mentioned, a supplementary base current is provided to the input transistors T3*a*, T3*b*. Therefore, transistors T3*a*, T3*b* will represent a high impedance to the source so that very little common mode current will be drawn through the input signal source. Consequently, the voltage drop which would result from a common mode current flow through the input signal source impedance is at a minimum, while at the same time the required base current to the input transistors is provided.

There is a problem in providing only a very small amount of current because transistors inherently don't operate at a very low level of current as far as their collector currents are concerned. What is done in the instant application is to provide PNP input current sources T1, T2 which have collector currents in excess of the base currents needed by the input transistors T3*a*, T3*b*. However, due to the current division networks using, for instance, the potentiometers R7 and R13, most of the collector current output from the input current sources T1, T2, is shunted into the emitter circuits of the input transistors T3*a*, T3*b*, where it has a negligible harmful effect. By controlling potentiometers R7, R13, it is possible to deliver the exact amount of base current required by the transistors in the first differential stage. This means that the input to the amplifier from the signal source is very small and very little error, due to the current flowing through the source impedance, is produced.

(4) The fourth function of the input control means 15, 17 in conjunction with the overall drift compensation network 50, is to compensate the amplifier for output voltage drift with temperature change. This can be explained more fully by referring to FIG. 2*a*. The network consisting of resistors R76, R77 . . . R80, and thermistor R79 is used to compensate the whole amplifier That is, output voltage drift with temperature is compensated by this network. The very large impedance R76 (approximately 22 megohms) is connected to the emitter of transistor T1 if the output of the amplifier drifts positive with increasing temperature. If the output drifts negative with increasing temperature, then the resistance R76 will be connected to the emitter of transistor T2. These connections exist at terminals A, B.

Figure 4:
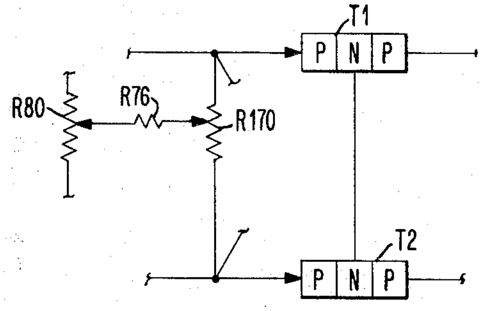
FIG. 4 is a diagram of an alternate overall temperature compensating network.

The voltage at the junction of R78, R77, and potentiometer R80 will vary with temperature due to the temperature dependent resistance variations of thermistor R79, while the voltage at the other end of the potentiometer R80 remains unchanged, due to the Zener diode D1. This diode acts like a battery and insures that the voltage at its anode is clamped at a particular value. Therefore, the position of the wiper of potentiometer R80 will determine at what rate the voltage at this wiper will change with temperature. As the voltage across the resistance R76 varies with temperature, a varying amount of current will be taken from either transistor T1 or T2, which current will flow through R76 to ground. This temperature varying current will equalize the collector current drift of T1 and T2 as well as generate a temperature varying signal at the emitters of the input transistors T3*a*, T3*b*. This will compensate for output voltage drift of the amplifier. The overall temperature compensating circuit can also be constructed so that R76 is connected to the wiper of a large value potentiometer whose ends are connected to the emitters of T1 and T2. The position of the wiper on this potentiometer would determine from which input current source the most temperature varying current would be taken by T3*a*, T3*b*. This is shown in FIG. 4, in which R76 is connected to a large value (approximately 5–10 megohms) potentiometer R170, whose ends are connected to the emitters of T1, T2.

(5) Adjustment of current sources 42, 44 provides a manual means of adjusting the output voltage via the output control, 19.

(6) Current sources 42, 44 when used in conjunction with common mode feedback 62 provide a means of feeding back common mode currents to the inputs 16, 18. The feedback to the inputs is by the same network which provides required base current to the input transistors T3*a*, T3*b*. The common mode feedback is instrumental in providing high common mode impedance for the amplifier, since it prevents the flow of common mode currents through the input signal source.

The output control means 19, FIG. 1, is used to correct the output voltage of the amplifier for variations due to drift, aging, temperature, etc. It is comprised of the overall temperature compensating network 50 and the zero control network 52. The operation of the overall temperature compensating network 50 has been described in conjunction with the discussion of the fourth function of the input control means 15, 17. Therefore, it is not necessary to go into further detail about the operation of this overall temperature compensation network. Because of the coaction of the overall temperature compensating network 50, comprising resistances R76, R77 . . . R80 and the input current sources T1, T2, only one temperature change is needed in setting up the amplifier to compensate drift. This will be more apparent when the particular alignment procedure is described below.

A zero control network, generally designated 52, comprises potentiometers R81, R82. By this zero control network, the base-emitter voltages of the input transistors T3*a*, T3*b* in the first differential stage 10 are made equal. Because error can result from places other than the amplifier itself, it is desirable that the offset be insensitive to gain. For instance, if there is a one millivolt offset on the input signal to the amplifier, it is important that the zero control can adjust the output voltage in order to remove this one millivolt offset. However, the amount of offset, one millivolt in this case, should be the same regardless of the gain to which the amplifier is set. In the particular zero control illustrated in FIG. 2*a*, the potentiometers R81, R82 act directly in conjunction with the input current sources T1, T2, and therefore the offset voltage will be insensitive to the gain of the amplifier, which gain is selected according to the resistance (R21, R22 . . . R26) that is inserted in the emitter circuit of input transistor T3*a*.

Further, the particular zero control comprising the potentiometers R81, R82 is inexpensive and does not introduce additional problems, such as drift, into the amplifier. One terminal point of potentiometer R81 is connected to the resistance R5 which in turn is connected to the emitter of transistor T2; the other terminal is connected to the potentiometer R82. The second terminal of potentiometer R82 is connected to the resistance R4 which in turn is connected to the emitter of transistor T1. The wiper of R81 is connected to the cathode of Zener diode D1 and to the positive bias line 74. The zero control network operates in conjunction with the input current sources T1, T2 in order to eliminate voltage offsets which would appear in the output voltage. This operation will be developed more fully now.

In order to better understand the operation of the input current sources T1, T2, the zero control network comprising R81, R82, and the overall temperature compensation network 50, the alignment procedure of the amplifier will now be discussed. The voltage drift of the amplifier, as well as the base current offset (to the input transistors T3*a*, T3*b*) and the initial common mode rejection, are a function of the alignment. The main criterium for the following procedure is to maintain the base-emitter voltages of input transistors T3*a*, T3*b* equal. The alignment procedure is as follows:

(1) The output voltage is shorted to ground to open the feedback loop 40 (nothing fed back).

(2) The input terminals 16, 18 are grounded.

(3) The emitters of input transistors T3*a*, T3*b* are shorted together.

(4) Alignment potentiometer R39 (connected in the collector circuits of transistors T3*a*, T3*b*) is adjusted for a zero differential voltage between the collectors of T3*a* and T3*b*.

(5) While still monitoring the differential voltage between the collectors of transistors T3*a*, T3*b*, one input is removed from ground and fed from a large value resistor (approximately 100K) that is grounded. The potentiometer R7 or R13 (connected to the collector of transistor T2 or T1 respectively) is now adjusted for zero voltage, (the particular potentiometer adjusted depends upon which input was ungrounded—if the input to transistor T3*a* were ungrounded then potentiometer R13 is adjusted, while if the input to transistor T3*b* were ungrounded then potentiometer R7 is adjusted). This adjustment establishes that all current being supplied by the current generator T1 or T2 to the ungrounded input is being accepted by the input transistor (T3*a* or T3*b*). That input is now returned to ground and the other input adjusted in a similar fashion. That is, if the input to T3*a* is not grounded and is fed from a large value resistor returned to ground, then potentiometer R13 is adjusted until a balanced condition (zero voltage) exists between the collectors of T3*a* and T3*b*. Then the current flowing through R14 will be equal to the required base current into T3*a* for a balanced condition. After the balanced condition is achieved, the input to T3*b* is ungrounded and the corresponding procedure is repeated with R7.

(6) The shorting connection is removed from the emitters of input transistors T3*a*, T3*b*.

(7) Zero control potentiometers R81 and R82 are adjuusted for zero potential, while still monitoring the voltage as in Step 4 (the differential voltage between the collectors of T3*a* and T3*b*. Two potentiometers are used in the zero control to achieve high resolution. This adjustment assures that the base-emitter voltages of the input transistors T3*a*, T3*b* are again equal.

(8) The output is now unshorted and a plus or minus 10 volts common mode signal (maximum common mode signal) is applied to the input terminals 16, 18. A low frequency (approximately 1 c.p.s.) signal is first applied and the potentiometer (R15, R16 . . . R20) for each gain setting is adjusted for minimum signal at the output. On the maximum gain setting, a higher frequency (approximately 1 kc.) common mode signal is applied and capacitor C6 is adjusted for minimum signal output. This variable capacitor, as mentioned previously, balances the reactive components of error voltage generated in the collectors of the input transistors T3*a*, T3*b* for optimum common mode rejection at frequencies about 10 c.p.s.

Its operation is as follows. In order to have good common mode rejection, the common mode impedances on both sides of the first differential stage (and also the other differential stages) must be balanced. The common mode impedance of the amplifier consists of an equivalent parallel RC network from each input to ground. These equivalent RC's come from the leakage resistance in the wiring, $R_{bc}$ of the input transistors T3*a*, T3*b*, the impedance of the current sources, and the impedance which is transferred to the base circuits of T3*a*, T3*b* from their respective emitters. It is important that R be high for good common mode impedance and that C be as small as possible. Also, the R's should be equal, and the C's should be equal. The C's should be small, since even a small capacity has a high impedance at low frequency. The potentiometers R15, R16 . . . R20 are used to balance the R's while capacitor C6 is used to balance the C's, in order that they be equal. If it were not for this balancing, common mode voltages would produce error signals at the output. Since there is an effective transformation of impedance from the emitter to the base in any transistor, C6 is located in the emitter circuit of T3*b*. The emitters of T3*a*, T3*b* are balanced to generate cancelling currents in the collectors of T3*a*, T3*b*.

(9) Another alignment means, potentiometer R46, connected in the collector circuits of second stage transistors T5*a*, T5*b*, is adjusted for zero voltage at the amplifier output.

(10) Since there is some interaction between various adjustments, it may be be necessary to repeat the alignment for optimum results.

(11) The amplifier is now oven-heated to 50° C. and the potentiometer R80 (located in the overall temperature compensation network 50) is used to return the output voltage to zero, in the manner described previously with respect to the discussion of this overall temperature compensating network. In this manner, the output voltage drift with temperature is compensated.

The previous description dealt with the input control means and the output control means. The common mode rejection means will now be described. This means provides very high common mode impedance and normal mode impedance. In this manner, the amplifier has extremely high rejection of common mode signals. Further, the rejection of common mode signals occurs in the first differential stage, so that these signals do not exist throughout the rest of the amplifier where they could be converted to differential signals and appear on the output as an error. The common mode rejection means comprises a common mode regulator 54 operating in conjunction with a common mode loop 56 and a common mode feedback network 62.

The common mode regulator, generally designated 54, is connected between the emitters of second stage transistors T5*a*, T5*b* and the emitter circuits of input transistors T3*a*, T3*b*. The connection from the second stage transistors T5*a*, T5*b* to the common mode regulator T4*a* is a high gain loop, which is designated as the common mode loop. Referring to FIG. 2*a*, this common mode loop comprises resistor R43 and grounded-base, amplifying transistor T10. The output from the collector of transistor T10 drives the base of the common mode regulator, transistor T4*a*. The collector of transistor T4*a* is connected to the junction of resistances R27, R29 which are in the emitter circuits of the input transistors T3*a*, T3*b*. The collector circuit of transistor T10 is also connected, through resistance R35, to the resistor R34 which is in the emitter circuit of transistor T4*b*.

Transistors T4*a* and T4*b* are a matched pair. The purpose of transistor T4*b* is to provide good temperature characteristics of the regulator, since compensation of the drift in transistor T4*a* can be matched by that in transistor T4*b*. The collector of transistor T4*b* is grounded and a parallel RC combination of capacitor C9 and resistor R33 is connected between the collector and base circuits of transistor T4*b*. The purpose of this RC combination is the same as that of R6, C5 in the base circuits of T1, T2. That is, C9 filters out noise while R33 provides bias current for Zener diode D5, which is connected between the emitter and base of transistor T4*b*. Diode D5, in conjunction with resistor R34, determines the current to the emitters of transistors T4*a*, T4*b*. It is the emitter current supply for the common mode regulator stage. The voltage of the cathode of Zener diode D5 is also utilized as the base voltage input to another current source, T11.

In the absence of common mode signals, the common mode regulator T4*a* acts as a current source for the input transistors T3*a*, T3*b*, in the manner discussed with respect to FIG. 3*b*. That is, transistor T4*a* acts as a constant current source (sink) connected to the emitter circuits of transistors T3*a*, T3*b* through resistances R27, R29, respectively. Further, if there is a common mode signal on the amplifier, T4*a* acts in such a way as to eliminate the common mode voltage at the collectors of the input transistors T3*a*, T3*b*; in this way, the common mode voltage is removed early, so that an error voltage does not occur in succeeding stages of the amplifier.

The common mode regulator action of transistor T4*a* is as follows. Since the voltage at the emitter of a transistor will follow that at its base, for common mode signal inputs, the voltage at the emitters of second stage transistors T5*a*, T5*b* will follow the common mode signals present at the collectors of input transistors T3*a*, T3*b*. The presence of a common mode signal $V_{cm}$ at the inputs 16, 18 to the amplifier dictates that the current through resistances R30, R31 must change by $V_{cm}$/R30 and $V_{cm}$/R31, if the output is to remain at zero potential. That is, since the output is fed back via lead 40 to resistance R31, in order that the output remain at zero potential, there must be an increased voltage drop across R31. (For balance, a dummy feedback resistor R30 is provided in the first differential stage.) In order to have the required increased current flow through resistances R31, R30, the collector currents of transistors T3*a*, T3*b* would also have to change by this amount if transistor T4*a* were a constant current source. This is so because, if T4*a* were a constant current source, the total current flowing in the emitters of transistors T3*a*, T3*b* would be constant. In order that the collector currents of transistors T3*a*, T3*b* not change significantly, an increased current must be supplied from the collector of transistor T4*a*.

Since the emitters of second stage transistors T5*a*, T5*b* are connected to transistor T4*a* through a high gain feedback loop 56 comprising resistance R43 and transistor T10, if the voltage at node 68 between transistors T5*a*, T5*b* begins to change due to common mode signals at the collectors of T3*a*, T3*b* this change will be amplified through transistor T10 and will be applied to the base of transistor T4*a*. This adjustment of base voltage on transistor T4*a* will adjust the collector current of T4*a* as required by the common mode input voltage. Since the additional current which is needed through resistance R31 in order to provide a zero potential at the output is provided by regulator T4*a*, the collector currents of transistors T3*a*, T3*b* will not change (or change very slightly). This means that very little base current will flow in the input transistors T3*a*, T3*b*; therefore, the action of the transistor T4*a*. This adjustment of base voltage on tranhigh gain feedback loop 56 and the common mode regulator T4*a* aids in achieving high common mode input impedance. In this way, the common mode voltage on the collectors of the first stage is kept very low. This is so even though the base voltages on the first stage transistors are going up and down a great deal. Very little signal gets through to the collectors of the first stage transistors. This is very desirable since, if the common mode voltage is kept out of the collectors of the first stage transistors, it is also kept away from the input to the second stage, so the problem of common mode to normal mode conversion in the second stage and following stages is minimized. Hence, these succeeding stages do not have to be so critical, with respect to balance, etc.

High input impedance, and hence the high common mode rejection with a source imbalance, is not achieved with just high gain in common mode loop 56. The collector-base resistances ($R_{bc}$) of input transistors T3*a*, T3*b*, and current sources T1, T2 are the main limiting factors. The common mode feedback network, generally designated 62 (FIG. 1), is used to achieve high common mode rejection by eliminating the flow of common mode current through the input signal source. This network is comprised only of passive elements, and principally a parallel combination of resistance and capacitance.

The common mode feedback network comprises resistance R83 in parallel with capacitance C7, and the resistances R154, R156. This feedback network links the collector of the common mode regulator T4*a* (at the node 96) to the emitters of input current sources T1, T2.

As background information in explaining the operation of this common mode feedback network the following is presented. The common mode voltage appears between the ground system of the amplifier and the ground of the source. The common mode current flows into both amplifier inputs via the common mode impedance of the amplifier. The current splits into two parts; one part flows in one input to the amplifier and the second part flows through the input signal source and its impedance into the other amplifier input. The source impedance and the portion of the common mode current which flows through it gives rise to a normal mode voltage. Since it is impossible to eliminate source impedance, a solution is chosen in which these common mode currents are eliminated by making the common mode impedance high. The impedance to ground in these two differential leads is the common mode impedance, which consists essentially of parallel combinations of the base-collector resistances of the first stage transistors, similar resistances in the current sources T1, T2, and also insulation resistance of the wiring. The common mode feedback network eliminates the flow of common mode current through the input signal source impedance by bucking it out with a second current which cancels it so that the net sum is zero. The resistance between the base and collector of a transistor ($R_{bc}$) is proportional to $l/i_c$, where $i_c$ is the collector current. Consequently, to make $R_{bc}$ infinite, $i_c$ is made very low.

If a common mode voltage is present at the inputs, the voltage is amplified by the high gain feedback loop (transistor T10) and is then applied to the regulator T4*a*. There is gain at the collector of transistor T4*a* for a common mode voltage at the inputs. The resistor-capacitor combination of R83 and C7 feeds current back to the emitters of input current sources T1, T2 and hence to the inputs of the amplifier. The current which is fed back depends upon the impedance of the parallel combination of R83 and C7, and is a function of the common mode input voltage. These currents compensate for losses due to collector-base resistances and capacitances in the input current sources T1, T2 and the input transistors T3*a*, T3*b*. That is, T1 and T2 are modulated by the common mode signal which is fed back, and these input current sources then generate current into the bases of transistors T3*a*, T3*b*. If the magnitude of the current delivered to the bases of T3*a*, T3*b* exactly matches the current which is lost in the base-collector impedances and that which is lost through leakage, then effectively the common mode impedance is made infinite. That is, the current which the common mode source would normally supply is being replaced by the feedback current, so that no common mode current flows through the source impedance. The common mode impedance presented by the input stage is then very high, as the input does not require a current to be drawn from the common mode source.

Even though the common mode currents in the collectors of the input transistors (T3*a*, T3*b*) are small, they can still generate a differential mode voltage due to imbalances in the collector load impedances of the input transistors and imbalance in the common mode current changes. The imbalance of the common mode current changes will vary with the gain setting, i.e., with the particular resistance R21, R22 . . . R26 which is connected between the emitter circuits of T3*a*, T3*b*. Hence, balance control means 21 (FIG. 1) is provided. This means comprises two common mode balancing networks. One network is the potentiometric common mode balance 58 and the other is the bucking common mode balance 60. The potentiometric network 58 is shown in FIG. 2*a*, while the bucking network 60 is shown in more detail in FIG. 5. This latter network sends in a signal which bucks out the imbalance and causes it to be zero. Thus, both common mode balance networks eliminate the conversion of common mode to normal mode, which conversion would result from mismatches in balance, etc.

The potentiometric common mode balance network 58 comprises the resistances R15, R16 . . . R20 which are connected to the emitter circuit of transistor T3*b*, through the resistance R30. There is one potentiometer R15, R16 . . . R20 for each gain setting of the amplifier. As was described in the alignment procedure, potentiometers R15, R16 . . . R20 provide adjustment of the equivalent RC networks which comprise the equivalent common mode impedance of the amplifier. Adjustment of the potentiometers R15, R16 . . . R20 makes the equivalent R's equal, for front end balance. As was also mentioned previously, the resistances R21, R22 . . . R26 are the gain setting resistors. For instance, if the gain is set on resistor R26 (contact *a*) the potentiometer R20 (contact *a'*) would be adjusted to provide common mode balance. A switch SW70 connects lead 23 to a particular gain setting resistor R21, R22 . . . R26 while at the same time it connects lead 72 to the associated potentiometer R15, R16 . . . R20. Thus, the switch SW70 makes connections *a–a'*, *b–b'*, etc. The wiper of each of the potentiometers R15, R16 . . . R20 is tied to the resistance R30.

The function of each potentiometer R15, R16 . . . R20 is to introduce an error current in the collector of transistor T3*b* (this is done indirectly through controlling the error current in the emitter of transistor T3*b*) which error current will cancel out the differential signal generated by a common mode signal at the inputs to the amplifier. Since there is not optimum balance from one gain setting resistor to the other with a single setting of a particular potentiometer R15, R16 . . . R20, various potentiometers are provided.

The common mode balance networks 58, 60, together with the common mode regulator network 54 provide very high common mode rejection with zero source imbalance. The variable capacitor C6, which is connected to the emitter of transistor T3*b*, is for balancing the reactive components of error voltage generated in the collectors of the input transistors T3*a*, T3*b* for optimum common mode rejection at any frequency greater than approximately 10 c.p.s. This capacitor maintains reactive balance of the amplifier from one half to the other half. Since the equivalent common mode network of the amplifier consists of a parallel RC combination tied between each input and ground, it is important that the equivalent "R's" be high and the equivalent "C's" be low for good common mode impedance. Also, the "R's" must be equal and the "C's" must be equal. The "R's" are made equal by adjusting the potentiometers R15, R16 . . . R20 while the "C's" are made equal by adjusting the capacitor C6. Since the emitter voltage follows the base voltage, C6 is located in the emitter circuit of T3*b*. Looking at it in another way, there is an impedance transformation (mathematically) from the emitter of a transistor to the base and, if the emitter of T3*a*, T3*b* are balanced, there will be generated cancelling current in the collectors of both T3*a* and T3*b*. Therefore C6 helps to balance the first stage.

Figure 5:
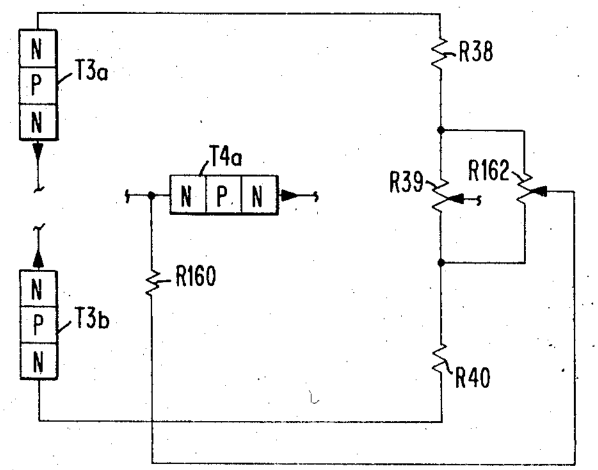
FIG. 5 is a diagram of the "bucking" common mode balance used in the subject invention.

The second network for providing common mode balance is the bucking common mode balance and is illustrated in FIG. 5. This figure represents a simplified drawing of the input stage to the amplifier and the common mode regulator T4*a*. The bucking common mode balance comprises the loop having resistance R160 and potentiometer R162. The terminals of potentiometer R162 are connected to the junction of resistances R38, R39 and to the junction of resistances R39, R40. Resistor R160 is connected to the emitter circuitry of T3*a*, T3*b* (collector of the common mode regulator T4*a*) and to the wiper of potentiometer R162. This means of providing common mode balance is very economical, as only one of the potentiometers R15, R16 . . . R20 is required if this network is utilized. However, where the number of gain positions is less than 3, there is no particular saving over the strictly potentiometric means 58 which was described above. Hence, for a number of gain positions less than 3 the potentiometric means for common mode balance is economically more feasible than the bucking common mode balance means 60, while at gain positions greater than 3, the latter becomes more economically feasible. Refering to FIG. 5, resistance R160 is typically a large value resistor, such as 5–10 megohms. The position of the wiper of potentiometer R162 determines the division of the common mode current fed through the large value resistor R160. This division determines the amount of canceling differential signals applied to the collectors of the input transistors T3*a*, T3*b*. Hence, this correction is applied directly to the collectors of T3*a*, T3*b*, rather than to the emitters of T3*a*, T3*b*, as is the case with potentiometers R15, R16 . . . R20.

As can be seen from the functional diagram of FIG. 1, the differential signal appearing at the collectors of the first stage transistors T3*a*, T3*b* is fed over leads 20, 22 as input signals to the bases of the transistors T5*a*, T5*b* in the second differential stage. Referring to FIG. 2*a*, these second stage transistors are matched transistors whose emitter circuits are tied together. The collectors of transistors T5*a*, T5*b* are connected to load resistors R45 and R47. Alignment potentiometer R46 is connected midway between these load resistors. The wiper of potentiometer R46 is connected, via lead 92, to the positive bias line 74. This potentiometer (46) is used for adjustment of the differential voltage between the collectors of the second stage transistors, during the alignment procedure. Therefore, its function for the second stage, is the same as that of alignment potentiometer R39 for the first stage. Also, the common mode loop 56 connects to the emitters of the second stage transistors T5*a*, T5*b* at node 68, as previously mentioned.

The second differential stage 12 operates in the same fashion as the first differential stage, i.e., it amplifies differential signals which are applied at its base inputs. Due to the common mode rejection means and the input control means 15, 17, very high common mode rejection is provided so that virtually no common mode signals appear at the collectors of second stage transistors T5*a*, T5*b*.

The third differential gain stage 14 comprises transistors T7, T8. A current source 64 for this gain stage is provided, which current source feeds the emitters of transistors T7, T8. The current source is the PNP transistor T6. The third differential stage transistors receive differential inputs on their bases from the collectors of transistors T5*a*, T5*b*. However, this stage is single-ended at its output, as the collector of transistor T8 is tied to ground. The current source T6 has its collector tied to the common node 76 of resistances R49 and R50, which resistances are connected directly to the emitters of transistors T7, T8, respectively. The positive bias line 74 is tied to the base of transistor T6 through the series combination of oppositely directed diodes D10, D11. Diode D11 is a Zener diode. The positive bias line 74 is also connected to the emitter of transistor T6 through resistor R51. The base of T6 is tied to ground through resistor R53. The collector output of transistor T7 is the single-ended input to the single-ended stage 30 (FIG. 1). This input is to the base of transistor T9. Further, the collector of transistor T7 and the base of transistor T9 are tied to ground through the series connection of diode D12 and resistor R55.

Transistor T6 operates as a biasing current source for providing emitter current to the third differential stage. It is a constant current source so the total current through R49 and R50 cannot vary; the total must be a constant. Therefore, when a differential signal is applied to the base inputs of transistors T7, T8, as one current (through either R49 or R50) goes down, the other must go up and differential action results. Since the emitter currents, that is, the total emitter current of transistors T7, T8 must be a constant, the collector currents of these transistors must behave in the same way. No matter what happens to the collector voltage of transistor T6, the current output from this transistor (T6) will remain constant, because diodes D10, D11 and resistance R51 are across the emitter of this transistor. Diode D11 is a Zener diode whose cathode is tied to the positive bias line 74 via lead 78. Consequently, diode D11 and resistor R51 act as a battery so that a constant amount of current will flow into the emitter of transistor T6. Since the base current to this transistor is approximately zero, the collector current is constant and essentially the same as the emitter current.

The diode D10 is a rectifier diode which is forward biased. Its temperature coefficient essentially cancels out the temperature coefficient of transistor T6, so that the voltage across resistance R51 is constant with temperature. Consequently, diode D10 compensates for temperature drift of the base-emitter voltage of transistor T6.

The next stage is the single-ended stage 30 comprising transistors T9, T12. Associated with this stage is the current source (66), or level setter, comprising transistor T11.

The series combination of rectifying diode D12 and resistance R55 are connected from the base of transistor T9 to ground. Resistor R56 is connected from the emitter of T9 to ground. Connected between the positive bias line 74 and the collector of transistor T9 is the series combination of resistance R57 and diode D13. The positive bias line 74 is also connected to the emitter of transistor T12 through the resistance R58. The collector of the current source T11 is connected to the collector of transistor T12 through resistance R59. Bias for transistor T11 is provided by Zener diode D5, which diode also provides bias on the base of transistor T4b. Connected to the emitter circuit of transistor T11 is the resistance R60.

The current source T11 helps bias transistor T12 and presents a high impedance to the collector of T12. That is, it is a constant current source for maintaining operating current in transistor T12 without lowering the interstage impedance between transistors T12 and T13. This high impedance is required to maintain loop gain in the internal feedback loop 36 comprising the resistor R67 and capacitor C14. Diode D13, connected in the collector circuit of transistor T9 and the base circuit of transistor T12, compensates for amplifier output voltage drift with temperature, due to changes with temperature of the base-emitter voltage of transistor T12.

The output of the single-ended stage 30 is taken from node 80. This output serves as the input to the final output stage, generally designated 32. The final output stage is an internal closed-loop amplifier which is operated in Class A–B for symmetrical drive. Its voltage gain is set by resistors R58 and R67. This is so since the amount of signal current generated at the collector of transistor T12 is related to the size of the emitter resistor R58. For a constant input signal to the base of T12, greater collector current changes will occur for smaller emitter resistances. Therefore, the input current signal to the final output stage will be determined by the value of the emitter resistance (R58) of T12. Of course, the feedback resistor R67 will affect the amount of current that the output will either give or take from the collector of transistor T12. It is essentially a current type of output circuit and is short circuit protected for any time duration. This circuit provides a low output impedance for the complete amplifier since the open loop output impedance of the internal amplifier is divided by two loop gains, the loop gain of the internal feedback amplifier (final stage) and the loop gain of the complete amplifier.

The final output stage comprises transistor T13, an emitter follower network, and the cross-coupled set of transistors T14–T17. Bias resistors R61, R62 are connected to the emitter and collector respectively of transistor T13. A series network comprising resistances R63, R64, R65, and R66, is connected between the positive bias line 74 and the negative bias line 82. An output is taken from the emitter of transistor T13 and applied to the common node of resistances R64 and R65. Consequently, the signal is applied to the emitters of transistors T15, T14 through resistances R64, R65, respectively. Bias resistor R66 is connected to the emitter of T14 and load resistor R68 is connected between the collector of transistor T14 and the positive bias line 74. Resistor R69 is a load resistor for transistor T15 and a bias resistor for the base of transistor T16. The bases of transistors T14 and T15 are connected to a common ground. Further, the collectors of transistors T16 and T17 are connected together through the series network comprising load resistances R71, R72. The output of the circuit is taken from the midpoint 84 of resistances R71, R72. From the output, a capacitor C15 is tied to ground. Resistance R73 is a bias resistor connected between the emitter of transistor T17 and the positive bias line 74. Resistor R70 is a bais resistor connected to the emitter of T16. The output of this final output stage is fed back to transistor T13 through an internal loop 36 comprising the parallel combination of R67 and C14.

The feedback from the output through the parallel combination of R67–C14 is the feedback network which controls the overall gain of the final output stage. The network consisting of transistors T14–T17 is a class A–B push-pull amplifier. The section comprising transistors T14, T15 connects into the stage comprising transistors T16, T17. That is, the output of the collectors of T14, T15 are inputs to the bases of transistors T16, T17, respectively. These final stages provide an output which is short circuit proof and has symmetrical driving properties because it drives equally hard in both directions—plus signals and minus signals. The final output stage is one which is not bothered with short circuits, saturation, or hang-ups.

Various diode networks are provided throughout the amplifier for special purposes. For instance, the Zener diodes D1, D5, and D11 make the current sources in the amplifier relatively insensitive to power supply variations. The common-base transistor T10 also provides a boot strap effect to the voltages across the collector resistors on the first stage. The overall effect of this boot strapping of the Zener diodes and of transistor T10 is to allow the use of relatively crude power supplies. Zener diode D1 has its cathode connected to the positive bias line 74 while its anode is connected to one terminal of potentiometer R80. Zener diode D5 has its cathode connected to the base of transistor T4*b*, while its anode is connected to the emitter of this transistor through resistance R34. Zener diode D11 has its cathode connected to the positive bias line 74 and its anode connected to the rectifying diode D10.

Various compensating diodes are also located throughout the amplifier. For instance, diode D2, which is located in a series back-to-back arrangement with Zener diode D1, compensates for temperature effects of this Zener diode. Diodes D12, D13 compensate for amplifier output voltage drift with temperature due to base-emitter voltage change of transistors T9 and T12. Diode D10, which is located in a back-to-back series arrangement with Zener diode D11 in the base circuit of transistor current source T6, compensates for temperature drift of the base-emitter voltage of transistor T6.

Rectifier diodes D3, D4 are provided to protect the base-emitter junctions of the input transistors, as was explained previously.

Various diode pairs are used to aid in the alignment procedure. For instance, the parallel combination of back-to-back diodes D6, D7 is located across the collectors of input transistors T3*a*, T3*b*. A similar diode combination comprised of diodes D8, D9 is located across the collectors of the second stage transistors T5*a*, T5*b*. In more detail, these back-to-back diode pairs limit the excursion of applied signals to the forward drop of the diodes. In so doing, the alignment procedure is facilitated. For instance, at the start of the alignment procedure, there is not perfect balance on each side of the amplifier and, when the power is turned on, imbalance results. If the imbalance is severe, the collectors of the first and second stage transistors will be turned off by several volts, so that a person aligning the amplifier would have to use a relatively wide range meter in his initial adjustment. As the adjustment proceeded he would have to switch to a lower range meter (millivolt scale, for instance). This disadvantage with respect to set-up time is eliminated by these diode pairs, which eliminate the excursion of applied voltages to ranges which will not cut off the differential stage transistors. Thus, the diode pairs D6–D7 and D8–D9 allow for easy alignment of this amplifier; they do not in any way effect the operation of the amplifier.

Included within the amplifier are many filter and roll-off networks. These networks remove excess gain and filter out any high frequency noise which may be present. For instance, capacitor C8 is located in parallel with the feedback resistor R31. This capacitor provides roll-off control so that the gain of the amplifier will be reduced as the frequencies increase substantially above the proper operating frequency of the amplifier. If the excess gain is not removed, the amplifier will go into oscillation at frequencies above the proper operating frequency of the amplifier. In the case of capacitor C8, as the operating frequency of the amplifier increases, the impedance of this capacitor decreases so that essentially all of the output signal will be fed back to the input. This will cause the gain of the amplifier to be reduced to unity and therefore the gain will be reduced at a controlled rate so that oscillation will not develop. The presence of capacitor C8 is another reason for the presence of the variable capacitor C6, as capacitor C6 would be needed to balance out the effects of capacitor C8, in addition to its function with respect to common mode balance.

Other roll-off control networks are provided throughout the amplifier. Two of these are the resistance-capacitance series networks that are tied from the collector of each input transistor to ground. Since common mode voltage is present on the collectors of the first stage transistors, there must be one of these roll-off networks for each collector. The roll-off network which is connected to the collector of transistor T3*a* is the series combination R42, C11, while the roll-off network that is connected to transistor T3*b* is the series combination R41, C10. A resistance-capacitance roll-off network is also provided for the transistors of the second differential stage. However, because common mode voltage is not present at the collectors of the transistors in the second differential stage, only one resistance-capacitance network is needed. This is the series combination of R44, C12, which is tied across the collectors of second stage transistors T5*a*, T5*b*. As mentioned previously, the functions of these roll-off control networks is to control the gain of the differential stages with respect to frequency, i.e., these RC networks remove gain at a controlled rate so that, at high frequencies, the amplifier will not go into oscillation. Several of these roll-off control networks are provided since, if the gain is removed too quickly, a nonstable amplifier will result. Therefore, there are staggered frequency points at which the networks being to reduce the gain and also particular frequency points at which these networks stop reducing gain. With respect to the resistance-capacitance networks outlined here, as the operating frequency of the amplifier increases, the impedance of the capacitor will decrease and the only impedance of the network will be due to the resistances, which are generally in the neighborhood of approximately 2K ohms. At these frequencies the gain reduction will occur. At low frequencies the capacitance has high impedance so that the gain will not be reduced at very low frequencies.

The amplifier is also provided with filter networks on the lower supply line so that noise will be eliminated from these lines. Specifically, there is located on the positive bias line 74 a low pass filter comprising resistance R74 and the parallel capacitive network of C20, C21. On the negative bias line 82 there is located a corresponding RC filter network, comprised of resistance R75 and the parallel capacitive network C18, C19. Theoretically, only one capacitor would be needed in each filter; however, due to the poor high frequency capabilities of the capacitors which handle low frequency AC signals, another capacitor is needed. Therefore capacitors C19, C21 are of large capacitance while capacitors C18, C20 are of low capacitance. These RC filter networks serve to isolate the output section from the input. They keep noise out of the sensitive front stage of the amplifier. This noise is noise which may result from the power supplies or from the output.

Other capacitors are also located on the power supply line. In FIG. 2*b*, capacitance C16 is tied between the negative bias line 82 and ground, while capacitor C17 is tied between the positive bias line 74 and ground. These capacitances remove noise from the power supply lines.

Located directly across the input terminals is capacitor C25. This capacitor serves two purposes which are the following:

The capacitor shorts out high frequency spikes of noise that may be on the input. It is desirable to remove these high frequency noises since they are considerably above the operational frequency range of the amplifier and could seriously affect the wide range front end of the amplifier. Also, capacitor C25 insures that the amplifier will be stable at high frequencies if, in a particular application, the input is lost from the front end. This can be harmful since, in some amplifiers, if the input is floating (nothing tied to the input) oscillation can result at high frequencies.

The capacitor C15, which is connected between the ouput and ground, filters high frequency signals from the output signal.

Thus, a differential amplifier is provided having extremely high common mode rejection, common mode impedance, and normal mode impedance. Also obtained are extremely accurate gain accuracy and excellent drift performance, both overall and with respect to the input current.

While the invention has been particularly shown and described with reference to the preferred embodiment thereof, it will be understood by those skilled in the art that various changes in form and detail may be made therein without departing from the spirit and scope of the invention.

What is claimed is:

1. A differential amplifier, having input and output terminals, for amplifying a differential signal applied to its input terminals, thereby producing an amplified output voltage, comprising:

a cascade of differential gain stages, the first stage being an input stage connected to the input terminals and being comprised of first and second transistors;

first and second input current sources for equalizing the base-emitter voltages of the transistors in the input stage and for reducing the necessary operating collector current in the first and second transistors;

the first current source being connected to a first current division network, the first current division network being connected to the first transistor and having a first current path connecting the first input current source to the base of the first transistor and a second current path connecting the first input current source to the emitter of the first transistor;

the second current source being connected to a second current division network, the second current division network being connected to the second transistor and having a first current path connecting the second input current source to the base of the second transistor and a second current path connecting the second input current source to the emitter of the second transistor.

2. The differential amplifier of claim 1, wherein the first and second stages of the cascade are common emitter stages and wherein the amplifier includes common mode rejection means connected between the first and second stages, for eliminating common mode signals at the collectors of the transistors in the first stage, whereby the amplifier output voltage is not affected by common mode signals;

the common mode rejection means comprising a common mode regulator and a common mode loop connected between the common mode regulator and the emitter circuitry of the second stage, the common mode regulator comprising a transistor having base, emitter, and collector electrodes, the base being connected to the common mode loop and the collector electrode being connected to the emitter circuitry of the first stage for providing current to the emitter circuitry of the transistors in the input stage, in order to maintain essentially constant the collector currents in the first stage transistors.

3. The differential amplifier of claim 2 wherein the common mode loop comprises a transistor connected in the common base configuration for amplifying the common mode signal present in the second stage emitter circuitry.

4. The differential amplifier of claim 2 wherein said common mode rejection means further comprises a common mode feedback network connected between the collector electrode of the common mode regulator and control electrodes of the input current sources for preventing erroneous differential mode input signals which result from the flow of common mode currents, thereby providing high common mode impedance.

5. The differential amplifier of claim 1 wherein a temperature compensating element is connected in one of the current paths in each current division network to compensate for temperature characteristics of the base-emitter voltage.

6. The differential amplifier of claim 5, where each input current source is a transistor having base, collector, and emitter electrodes, the collector being connected to said current division network, the base being connected to a reference voltage and the emitter being connected to a control circuitry.

7. The amplifier of claim 1 wherein output control means is connected to the input current sources for compensating the output voltage drift of the amplifier and for zero control of said output voltage;

said output control means comprises an overall temperature compensation network connected to a control electrode of one of the input current sources, and a zero control network;

said temperature compensation network comprising a resistive voltage divider wherein the resistance of one of the resistive elements is temperature dependent;

the zero control network connected to both input current sources, for zeroing the voltage offset of the differential amplifier, the zero control network comprising a potentiometer having first and second ends and a tap, the tap being connected to a reference potential, the first end of the potentiometer being connected to the control electrode of one of the input current sources, and the second end of the potentiometer being connected to the control electrode of the other input current source.

8. A differential amplifier, having input and output terminals, for amplifying a differential signal applied to its input terminals, thereby producing an amplified output voltage, comprising:

a cascade of differential gain stages, the first stage being an input stage connected to the input terminals and being comprised of first and second transistors, each differential stage being comprised of at least a pair of transistors having base, collector, and emitter electrodes, the first and second stages being common emitter stages;

first and second input current sources for equalizing the base-emitter voltages of the transistors in the input stage and for reducing the necessary operating collector current in the first and second transistors;

the first current source being connected to a first current division network, the first current division network being connected to the first transistor and having a first current path connecting the first input current source to the base of the first transistor and a second current path connecting the first input current source to the emitter of the first transistor;

the second current source being connected to a second current division network, the second current division network being connected to the second transistor and having a first current path connecting the second input current source to the base of the second transistor and a second current path connecting the second input current source to the emitter of the second transistor;

an overall temperature compensation network connected to a control electrode of one of the input current sources, the temperature compensating network comprising a resistive voltage divider wherein the resistance of one of the resistive elements is temperature dependent;

a zero control network connected to both input current sources, for zeroing the voltage offset of the differential amplifier, the zero control network comprising a potentiometer having first and second ends and a tap, the tap being connected to a reference potential, the first end of the potentiometer being connected to the control electrode of one of the input current sources, and the second end of the potentiometer being connected to the control electrode of the other input current source;

common mode rejection means connected between the first and second stages, the common mode rejection means comprising a common mode loop and a common mode regulator;

the common mode loop being connected between the emitter circuitry of the second stage and the common mode regulator, and comprising a resistor and an amplifying transistor for providing an amplified common mode signal to the common mode regulator;

the common mode regulator being connected between the common mode loop and the emitter circuitry of the first stage, for controlling the total current flowing through the first stage emitter circuitry.

9. Differential amplifier of claim 8, wherein the common mode rejection means further comprises a passive common mode feedback network connected between (the common mode regulator output) and the control electrodes of the pair of input current sources.

10. A differential amplifier, having input and output terminals, for amplifying a differential signal applied to its input terminals thereby producing an amplified output voltage, comprising:

a cascade of differential gain stages, the first stage being an input stage connected to said input terminals, each differential stage being comprised of at least a pair of transistors having base, collector, and emitter electrodes;

a pair of input current sources, each of the pair being connected to a current division network, the current division network being connected to one of said first stage transistors, each current division network having a first current path connecting the input current source to the base of the first stage transistor and second current path connecting the input current source to the emitter of the first stage transistor for equalizing the base-emitter voltages of the transistors in the input stage and for reducing the necessary operating collector current in these transistors.

References Cited

UNITED STATES PATENTS

| | | | |
|---|---|---|---|
| 3,328,599 | 6/1967 | Stupar | 330—30X |
| 3,399,357 | 8/1968 | Weilerstein | 330—30X |
| 3,444,472 | 5/1969 | Johnson | 330—30X |

NATHAN KAUFMAN, Primary Examiner

U.S. Cl. X.R.

330—69, 14